United States Patent
Dour et al.

(10) Patent No.: US 7,020,818 B2
(45) Date of Patent: Mar. 28, 2006

(54) METHOD AND APPARATUS FOR PVT CONTROLLER FOR PROGRAMMABLE ON DIE TERMINATION

(75) Inventors: Navneet Dour, Folsom, CA (US); Roger K. Cheng, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 10/796,353

(22) Filed: Mar. 8, 2004

(65) Prior Publication Data

US 2005/0194991 A1 Sep. 8, 2005

(51) Int. Cl.
*G01R 31/28* (2006.01)
(52) U.S. Cl. .................. 714/724; 714/725; 714/727; 326/30; 326/32
(58) Field of Classification Search .................. 326/30, 326/82, 83; 714/724–727
See application file for complete search history.

(56) References Cited

U.S. PATENT DOCUMENTS

| 6,380,758 | B1 * | 4/2002 | Hsu et al. ................. 326/30 |
| 6,445,316 | B1 * | 9/2002 | Hsu et al. ................. 341/120 |
| 6,624,659 | B1 * | 9/2003 | Abraham et al. ............ 326/82 |
| 2004/0225830 | A1 * | 11/2004 | DeLano ................. 711/105 |

* cited by examiner

*Primary Examiner*—Vibol Tan
(74) *Attorney, Agent, or Firm*—Blakely, Sokoloff, Taylor & Zafman LLP

(57) ABSTRACT

Embodiments include an on die termination circuit. The on die termination circuit may be programmable. The on die termination circuit may be programmed to compensate for environmental conditions and the physical characteristics of the device. The programmed on die termination circuit allows for faster transfer rates over communication lines by reducing the time needed to recover from signal reflection and similar issues.

9 Claims, 5 Drawing Sheets

US 7,020,818 B2

METHOD AND APPARATUS FOR PVT CONTROLLER FOR PROGRAMMABLE ON DIE TERMINATION

BACKGROUND

1. Field of the Invention

The embodiments of the invention relate to terminating signals. Specifically, embodiments of the invention relate to terminating signals with a programmable on die termination circuit to maximize transfer rates.

2. Background

Computer systems are comprised of a set of components that communicate with each other over buses and similar communication lines. Computer system components include processors, communication chipsets, memory modules, peripheral components and similar devices. These devices communicate with one another over a set of buses. These busses may utilize communication protocols understood by each of the components on the bus. Some components act as bus controllers to manage communication traffic on the bus.

Computer system speed and efficiency is limited by the speed of buses and communication lines in the computer system. A processor relies on a system bus, memory bus and memory controller for retrieving data and instructions from system memory. The processor is limited in the speed at which it can process these instructions by the speed at which it can receive the data and instructions over the system bus and memory bus from system memory.

Buses are typically communication lines laid out on a printed circuit board such as the main board of a computer system. Components in the computer system have pins that connect to the lines of the bus. The components communicate across the bus by driving a signal across lines of the bus. These signals are latched by a recipient device. The signal is terminated by an on board termination circuit which includes a resistor or similar component. If a signal is not properly terminated then a reflection of the signal may occur or other noise may affect subsequent signaling on the line.

BRIEF DESCRIPTION OF THE DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
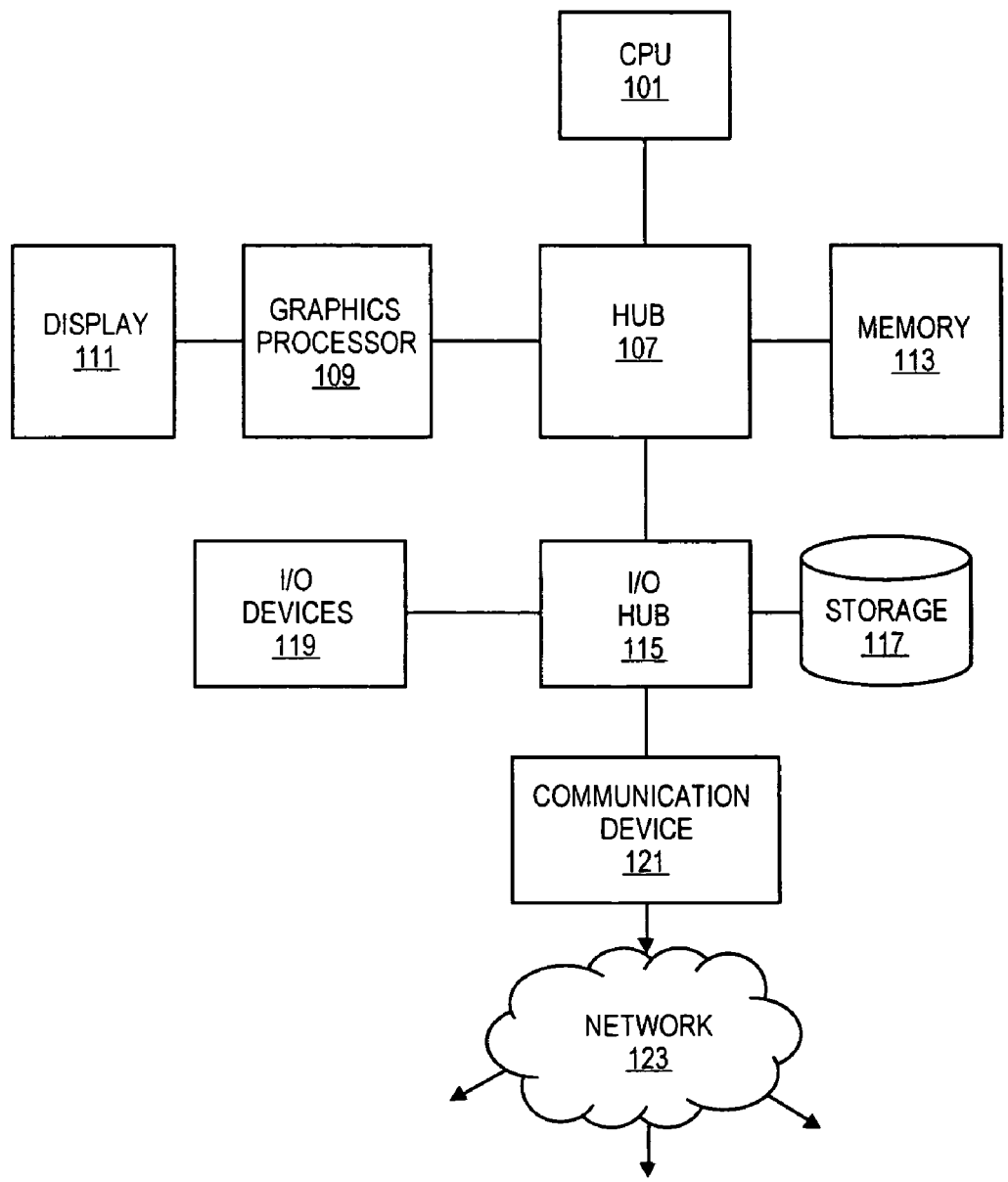
FIG. 1 is a block diagram of one embodiment of a computer system.

FIG. 1 is a block diagram of one embodiment of a computer system. In one embodiment, the computer system may include a processor 101 for executing instructions of programs. Program instructions may be retrieved from memory 113 or similar sources. The computer system may include multiple processors. In one embodiment, processor 101 may be in communication with a hub 107. Hub 107 may facilitate communication between processor 101, memory 113, graphics processor 109 and similar input and output devices. In one embodiment, hub 107 may be a component or chipset on a mainboard or similar platform. Hub 107 may be a "Northbridge" chipset. In one embodiment, graphics processor 109 may be a component or chipset on a mainboard or similar platform. In another embodiment, the graphics processor 109 may be on a peripheral card connected to the mainboard or platform via an accelerated graphics port (AGP) or similar connection. Graphics processor 109 may be in communication with a monitor 111 or display device. A display device may be a cathode ray tube (CRT) device, liquid crystal display device, plasma display device or similar display device.

In one embodiment, hub 107 may be in communication with input output (I/O) hub 115. I/O hub 115 may facilitate communication between hub 107 and I/O devices 119, storage devices 117 and similar devices. In one embodiment, I/O hub 115 may be a component or chipset on a mainboard or similar platform. I/O hub 115 may be a "Southbridge" chipset. I/O hub 115 may be in communication with a communications device 121. Communications device 121 may be a network card, wireless device or similar communication device.

In one embodiment, the computer system may be connected to a network 123 through communications device 121. The computer system may communicate through network 123 with a remote system such as a computer system, console device, handheld device, sensor or similar system.

Figure 2:
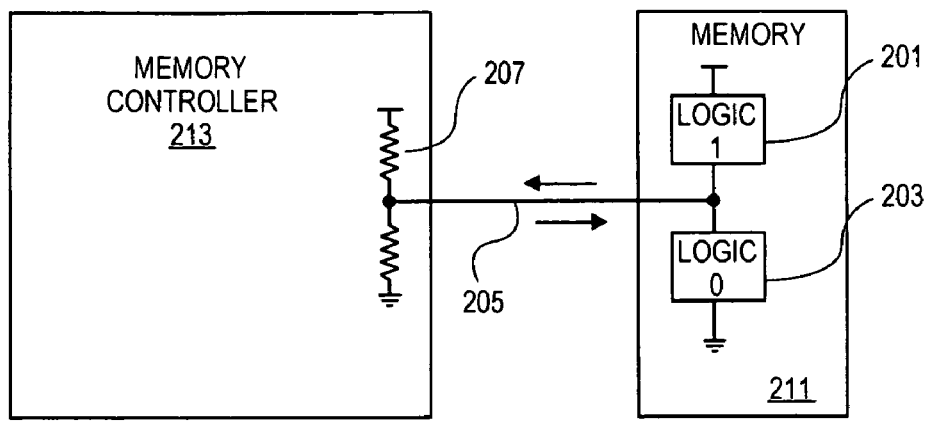
FIG. 2 is a block diagram of one embodiment of a communication line between a memory controller and a memory module.

FIG. 2 is a diagram of one embodiment of a communication line between a memory controller and a memory module. In one embodiment, a memory module 211 communicates with memory controller 213 via a communication line 205. A memory module 211 may be a dynamic random access memory module or similar memory module type. The memory module may be packaged as a dual in line memory module (DIMM), single in line memory module (SIMM) or similar memory module configuration. Memory module 211 may be a double date rate (DDR) module or similar type of memory module. In one embodiment, memory controller 213 may be a direct memory access (DMA) controller, NorthBridge chipset or similar device. Communication line 205 may be a part of a system bus such as a front side bus, a memory bus, or similar communication line. The diagram shows a single communication line. Memory module 211 and memory controller may communicate over any number of communication lines in parallel or in similar configurations.

In one embodiment, memory module 211 has a set of driving circuits 201, 203 to drive a signal over communication line 205. Memory module 211 may have a set of logic one circuits 201 to drive a logical 'one' signal over communication line 205. For example, the logical one signal may be a relative high voltage signal. In one embodiment, memory module 211 may have a set of logic zero circuits 203 to drive a logical 'zero' signal over communication line 205. For example, the logical zero signal may be a relative low voltage signal.

In one embodiment, memory controller 213 or similar receiving circuit may be connected to communication line 205. Any circuit chip, or component may be coupled to communication line 205 and receive a signal sent by another chip, component, or circuit. For example, memory module 211 may send a set of signals to memory controller 213 where communication line 205 is part of a memory bus.

In one embodiment, a receiving circuit must terminate an incoming or received signal to prevent reflection of the signal and noise on communication line 205. A receiving device such as memory controller 213 may utilize a set of resistors 207 to terminate the incoming signal. Resistor 207 must have a resistance of appropriate size to terminate the signal properly. In another embodiment, communication line 205 may be bidirectional. A terminations circuit may be utilized at both the receiving circuit and the driving circuit.

Figure 3A:
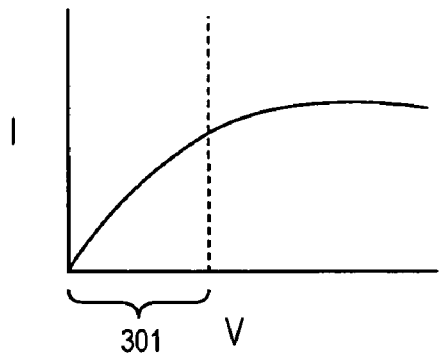
FIG. 3a is a diagram of one embodiment of the behavior of a signal on a communication line utilizing an on die termination circuit.

FIG. 3A is a diagram of the behavior of a signal on a communication line utilizing known on die termination circuits. The diagram shows the relative current (I) and voltage (V) of a signal that is received by a device when the signal transitions from a high voltage to a low voltage. The diagram shows a signal when the resistance of the line receiver is not attuned to the conditions of the line or the strength of the incoming signal. This results in a transition period 301, such as a change in voltage level in a signal, exhibiting fluctuations in the resistance to a signal. The resistance is the relationship between the current and voltage that the diagram shows as a curved line. This behavior of known on die termination circuits is undesirable because it does not maintain a constant relationship between current I and voltage V during periods of voltage change 301 to minimize signal reflection and maximize the signaling rate of a communication line.

Figure 3B:
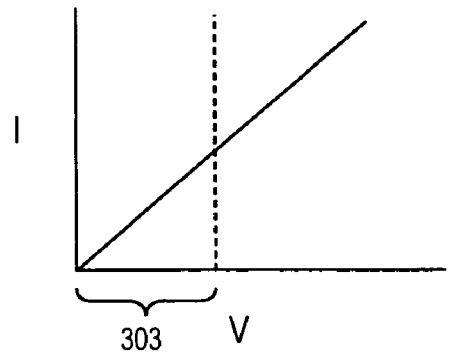
FIG. 3b is a diagram of one embodiment of the behavior of a signal on a communication line with programmed on die termination.

FIG. 3B is a diagram of the behavior of a signal on a communication line with programmable on die termination. The diagram shows a signal where the on die termination has been calibrated for the conditions of the chip. The transition period of the signal 303 exhibits a constant resistance. The constant resistance facilitates the termination of the signal as the strength of the signal is fully absorbed by the on die termination circuit. This allows higher communication speeds on the communication line. Higher communication speeds are possible because the communication line may be available to transmit the next signal in a shorter time period. A communication line may be unavailable or unusable when signal reflection and similar noise occurs on a line due to poor termination of the previous signal. If the previous signal is properly terminated with a constant resistance to the signal over the transition of the signal from one voltage level to another voltage level then the communication line may be used for transmitting the next signal without an extensive delay to allow for signal reflection and similar noise to subside. This improved performance may be attained without the need for the extra board area and added component cost required by on board termination.

Figure 4:
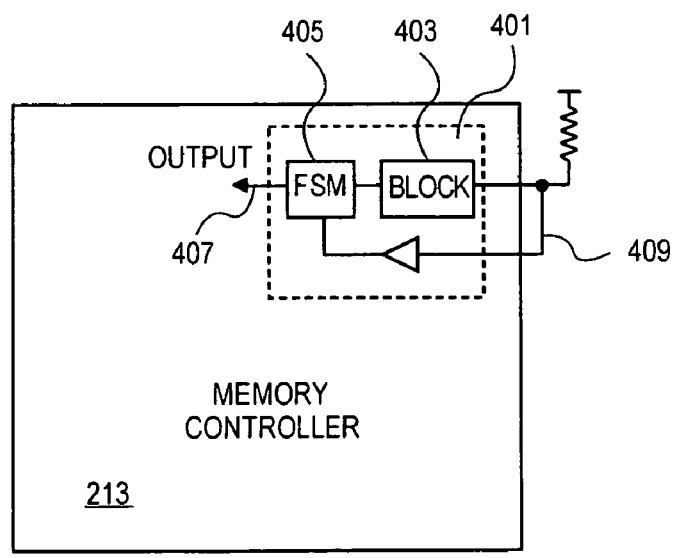
FIG. 4 is a diagram of one embodiment of a feedback test circuit.

FIG. 4 is a diagram of one embodiment of a condition testing circuit. In one embodiment, a device may include a testing circuit 401 to determine conditions in the device. A device may be any component chip or similar device that communicates with other devices in a computer system. For example, a device may be a memory controller or similar device. The testing circuit may include test block or circuit block 403 including a block of circuits that are representative of other circuit blocks in the device. Circuit block 403 may be part of a feedback loop 409 that receives an off die signal or power source and includes a finite state machine 405.

In one embodiment, finite state machine 405 monitors the signals in the feedback loop and functions as an encoder that generates an encoding for the conditions of circuit block 403. The conditions that finite state machine 405 may encode include the effects of the physical characteristics of the device, such as the quality and type of manufacture, materials and similar physical characteristics, temperature, voltage and similar device conditions have on the signal processed by circuit block 403. In one embodiment, finite state machine 405 may encode the impedance of signals in block 403 based on physical characteristics, voltage levels, and temperatures (PVT) of block 403. Finite state machine 405 may encode the conditions in a signal output to an internal communication line 407. This signal may be used by compensation circuits to adjust the operation of other blocks in the device to correct for conditions in the device and thereby improve the performance of the device.

In one embodiment, the conditions in the device may be encoded in an 8 bit format. In another embodiment, the conditions may be encoded in any sized signal or format. This signal may be used to drive adjustment circuits in other blocks. The encoded condition may have a more precise encoding of the conditions than are utilized by the adjustment circuits in the other parts of the device. For example, the testing circuit 401 may generate an 8 bit encoding of the device conditions. The adjustment circuits may only utilize an approximated 5 bit encoding of the conditions in the device. In one embodiment, a device may have multiple testing circuits. The outputs of these circuits may be utilized for different regions of the device. In another embodiment, the output of multiple testing circuits may be combined for a composite condition encoding.

Figure 5:
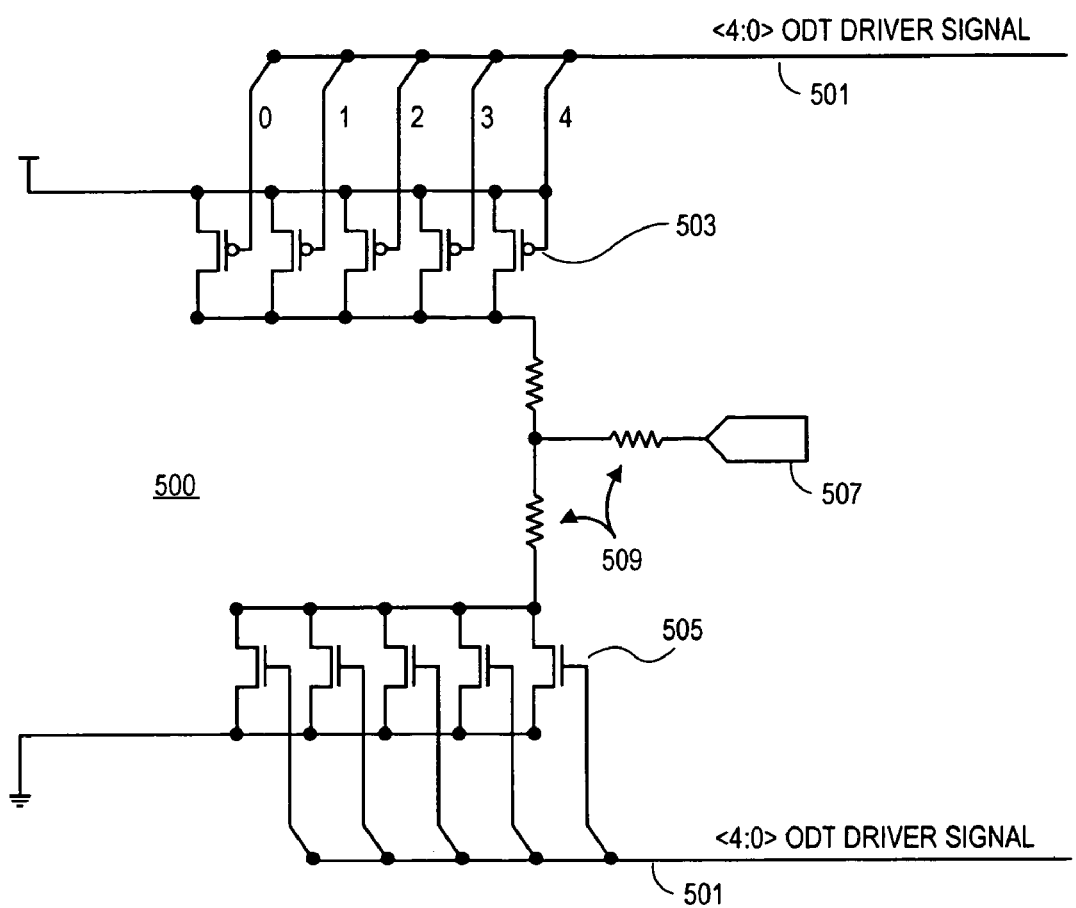
FIG. 5 is a diagram of one embodiment of a circuit for programmable one die termination of a signal.

FIG. 5 is a diagram of one embodiment of an on die termination circuit having a driver circuit to adjust the resistance to an incoming signal. In one embodiment, termination circuit 500 may be electrically coupled to an input pad 507. Input pad 507 may be connected to a pin or similar structure that is coupled to a communication bus to receive a signal from other devices. Input pad 507 may be coupled to on die termination circuit 500. On die termination circuit 500 may absorb the incoming signal to prevent the reflection of the signal and to minimize noise on the communication line.

In one embodiment, a receiving circuit or input pad 507 may be coupled to a set of resistors 509. In one embodiment, set of resistors 509 may include three resistors for absorbing incoming signals. The three resistors may be polyresistors. In one embodiment, the resistors may be composed of polysilicide or similar material. Set of resistors 509 may have an overall resistance to an incoming signal that is based on the strength of signal generating devices. In one embodiment, the distribution of the resistance between the resistors may be use to adjust the properties of on die termination circuit 500. In one embodiment, the resistor coupled in series with the other resistors and positioned on the input pad leg of the circuit may have a proportionately large size in comparison with the parallel resistors coupled to transistor sets 503, 505. In this configuration the resistance of on die termination circuit 500 to an incoming signal exhibits a greater linearity than if a greater proportion of the resistance was placed in the resistors in series coupled to transistor sets 503, 505.

In another embodiment, the distribution of the resistance amongst resistors 509 may be used to improve the range of resistance that can be provided. In this embodiment, larger matching resistors are used in series in the legs of set of resistors 509 that are coupled to set of transistors 503, 505 than in the input pad leg. In this configuration a greater range or resistances can be provided to allow more programmable resistance settings.

In one embodiment, the resistance to the incoming signal is added to and configurable based on sets of transistors 503 and 505. Transistor set 503 may be a set of PMOS transistors that form a pull up resistor in combination with the resistor from the set of resistors 509 coupled to the set of PMOS transistors. A set of complementary NMOS transistors 505 may be coupled to the other parrallel leg of the set of resistors 509 to form a pull down resistor. The sets of transistors 503, 505 may be programmed by a driver signal 501 generated by the testing circuit or similar signal source. Driver signal 501 may activate or deactivate a complementary set of transistors from PMOS and NMOS transistors 503, 505 to vary the resistance provided by the pull up and pull down resistors. Driver signal 501 may be based on the conditions of the device and thereby adjust the resistance to properly terminate an incoming signal based on the conditions of the device. These conditions may change dynamically and driver signal 501 may dynamically alter the resistance of the on die termination circuit 500 accordingly to allow transistor sets 503, 505 to act as a compensation circuit. Transistor sets 503, 505 may be isolated from input pad 507 by resistors 509 to minimize the resistive value of the transistors due to voltage changes at the input pad.

Figure 6:
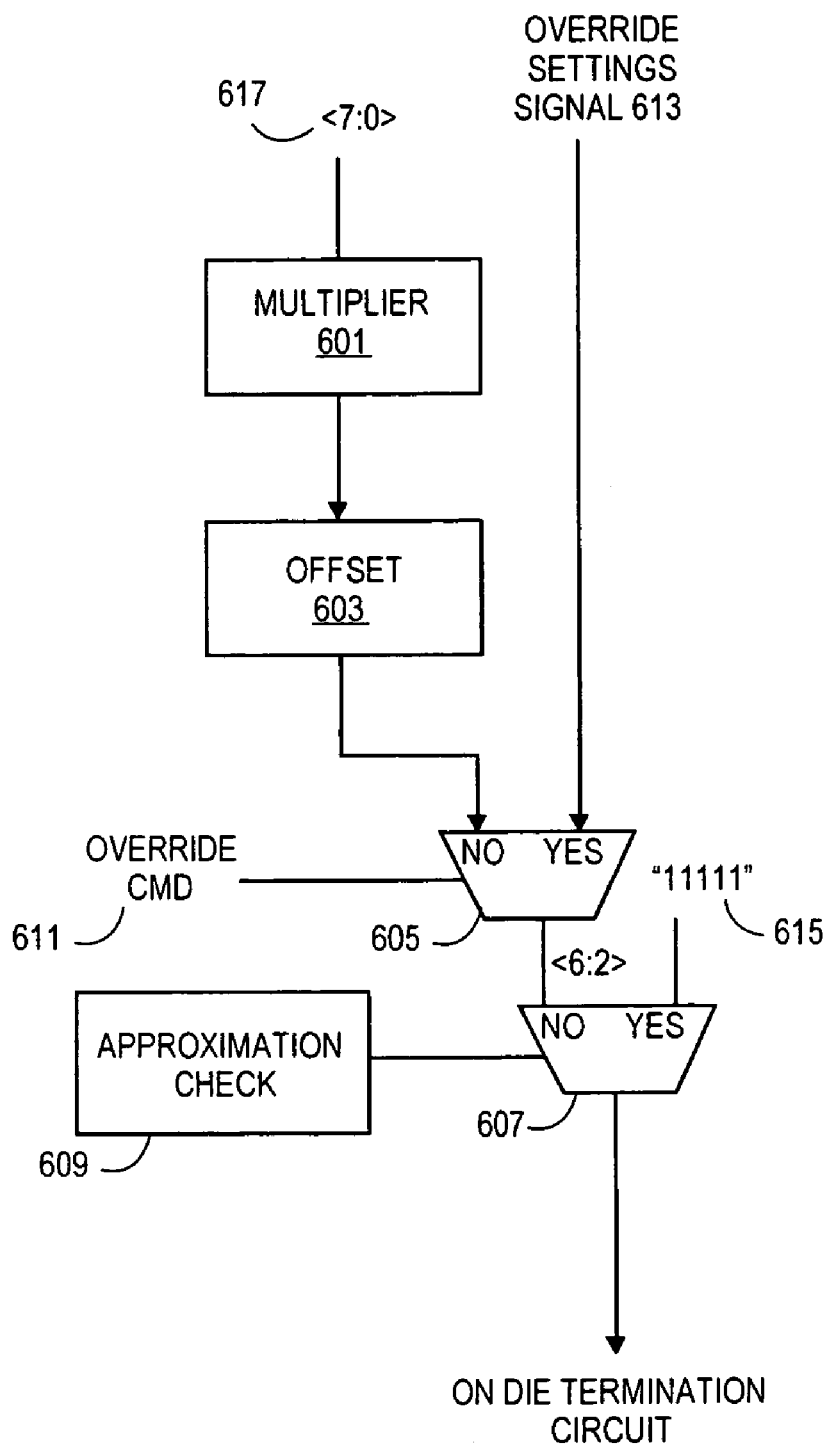
FIG. 6 is a diagram of one embodiment of circuit for converting a format of an encoded condition signal.

FIG. 6 is a block diagram of one embodiment of a conversion circuit to convert a condition code into a driver signal for an on die termination circuit. In one embodiment, a device or chip may generate a condition code having greater precision than supported by an on die termination circuit. In one embodiment, an encoded condition signal is in an 8 bit form. For example, a 865/875 chipset from Intel Corporation, stores an 8 bit condition encoding in an rcomp register which may be used by the on die termination circuit. In one embodiment, the on die termination circuit may utilize a 5 bit driver signal. A conversion circuit may approximate the 8 bit signal in a 5 bit form. In one embodiment, an on die termination circuit may utilize an approximated or truncated condition code because a small number of legs in the driver circuit are used to conserve space on die.

In one embodiment, condition code signal 617 may be input into a multiplier 601. Multiplier 601 may adjust the encoded signal by multiplying the signal to adjust for the conditions of the on die termination circuit based on the relation of the voltage level at which the signal was encoded to the voltage level of the on die termination circuit. For example, if the voltage level of condition code signal 617 is twice the voltage level of the on die termination circuit the multiplier may be a ½ or 0.5 multiplier. Multiplier 601 may have a set number of multipliers that may be applied to the incoming condition code signal 617. For example, multiplier 601 may support ½, ⅝, ¾, ⅞, 1, ⁹⁄₈, ⁵⁄₄, and ³⁄₂ multiplications of the encoded condition signal 617. In one embodiment, an offset or adder component 603 may be used to further modify the encoded signal to compensate for differences in the operation, voltage level, characteristics and similar conditions of the on die termination circuit. Offset component may be used to make a static adjustment to encoded condition signal 617.

In one embodiment, a manual or test mode may be supported by a device. In a manual, test or similar scenario an override mode may be used to directly set the condition code for the device thereby ignoring the actual device conditions. In one embodiment, override setting signal 613 supplies the replacement condition code. The replacement condition code may be provided in a format intended for other components of the device and may need to be adjusted in the same manner as the encoded condition signal. In another embodiment, the replacement condition code may be supplied in a format directly useable by the on die termination circuit. A multiplexor 605, switch or similar circuit driven by an override command signal 611 may choose between the override settings signal 613 and the adjusted condition code signal 617.

In one embodiment, a further set of checks may be made of the adjusted condition code signal. In one embodiment, an approximation check may be made. If the highest order bits of a condition code are not used in the approximated signal an approximation check may designate a set value to be utilized for all adjusted condition codes that have logic 'one' values in the highest order bits that are not utilized in the approximated driver signal. For example, if an 8 bit encoding is being approximated by a 5 bit encoding by utilizing all the bits of the 8 bit encoding except for the highest order bit and the two lowest order bits, then an approximation check determines if the highest order bit is a logical one. If the bit is a one then the highest approximated value may be used, such as an all logical ones 5 bit value '11111.' Multiplexor 607 may select between the designated replacement value and the adjusted condition code signal 607 based on detection of a high order '1' bit or similar approximation triggering condition.

In one embodiment, the approximation check may also include an overflow check. An overflow check may be made to determine if the multiplier component 601 or offset component 603 caused condition code signal 617 to overflow. The overflow check component may test to determine if the multiplier component 601 or offset component 603 cause the highest order bit in condition code signal 617 to change from a logical 1 to a logical 0 due to the overflow. In one embodiment, this overflow error may be corrected for by designating an encoding to approximate all the high value condition codes that result from an overflow. For example, an all logical ones '11111' value may be used in a 5 bit encoding for all adjusted condition codes that generated an overflow signal during multiplication or offset. Multiplexor 607 may select between the designated replacement value for approximation checks and the actual adjusted condition code signal to be output to the on die termination circuit based on the detection of an overflow.

Figure 7:
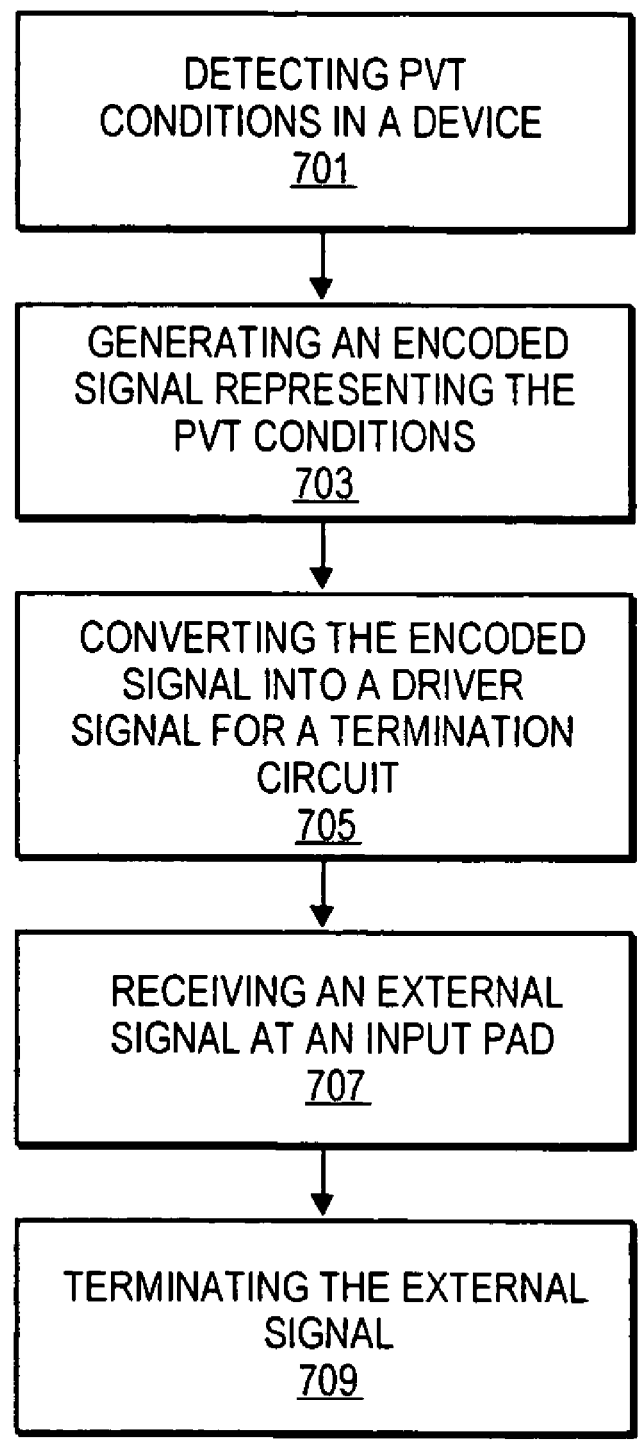
FIG. 7 is a flowchart of one embodiment of a process for terminating a signal on die.

FIG. 7 is a flowchart of one embodiment of a process for programming an on die termination circuit to adjust for conditions in a chip or device. In one embodiment, a testing circuit or similar component detects the physical conditions, voltage conditions and temperature conditions (PVT) of the component or on die termination circuit (block 701). After the PVT conditions have been detected an encoded signal representing the signal may be generated by a testing circuit or similar circuit (block 703).

In one embodiment, the encoded condition signal may be used as a driver signal to adjust the on die termination circuit. In another embodiment, the encoded condition signal may need to be converted into a format suitable for driving the on die termination circuit (block 705). The driver signal may be used to set the resistance level of the on die termination circuit based on device conditions. An input signal may be received by the on die termination circuit at an input pad (block 707). The properly adjusted on die termination signal then terminates the incoming signal by providing a constant resistance at a sufficient level to terminate the incoming signal (block 709). This results in minimal noise and signal reflection on the communication line coupled to the input pad.

In one embodiment, the programmable on die termination circuit reduces noise and signal reflection quickly enough and thoroughly enough to allow the communication line to improve its transfer rate. In one embodiment the communication line communicating with a device with a programmable on die termination circuit may be capable of 400 megatransfers per second (MTS). In one embodiment, the communication channel may be a double data rate (DDR) memory bus, or similar communication line.

In one embodiment, the on die termination circuit may be used by memory controller chipsets or any circuit communicating on a bus or similar communication line. In one embodiment, programmable on die termination circuits may provide consistent programmable target impedance throughout a PVT range by providing flexibility in settings via the multiplier and offset components of the conversion circuit. The on die termination scheme may conserve space on and decrease cost of main boards and similar platforms. The on die termination scheme also allows the same devices to be used in different environments and systems due to their programmable termination settings.

The system for programmable on die termination may be implemented in software, for example, in a simulator, emulator or similar software. A software implementation may include a microcode implementation. A software implementation may be stored on a machine readable medium. A "machine readable" medium may include any medium that can store or transfer information. Examples of a machine readable medium include a ROM, a floppy diskette, a CD-ROM, an optical disk, a hard disk, a radio frequency (RF) link, and similar media and mediums.

In the foregoing specification, the invention has been described with reference to specific embodiments thereof. It will, however, be evident that various modifications and changes can be made thereto without departing from the broader spirit and scope of the embodiments of the invention as set forth in the appended claims. The specification and drawings are, accordingly, to be regarded in an illustrative rather than a restrictive sense.

What is claimed is:

1. An apparatus comprising:
a test block to determine a condition on a chip;
an encoder to encode the condition to a first encoded condition;
a conversion circuit to convert the first encoded condition into an approximated second encoding; and
a compensation circuit to adjust an on die termination circuit based on the approximated second encoding.

2. The apparatus of claim 1, further comprising:
a receiving circuit to receive an incoming signal, the receiving circuit to receive a third encoded condition and compensate the termination of the signal for the condition.

3. A system comprising:
a processor;
a first bus coupled to the processor;
a memory device;
a second bus coupled to the memory device;
a memory controller coupled to the first and second buses, the memory controller having a programmable on die termination circuit, a conversion circuit to convert a first encoded signal representing a condition in the memory into an approximated second encoding to program the on die termination circuit.

4. The system of claim 3, wherein the memory controller can receive data over the second bus at a rate between 200 and 400 megatranfers per second (MTS).

5. The system of claim 3, wherein the memory controller further comprises the testing circuit to determine the condition in the memory controller and generate the first encoded signal representing the condition.

6. A method comprising:
detecting a condition in a device;
generating an encoded signal representing the condition;
converting the encoded signal into a truncated condition code to program the on die termination circuit; and
programming an on die termination circuit to compensate for the condition.

7. The method of claim 6, further comprising:
receiving an external signal at a rate of 200 to 400 mega transfers per second (MTS) at the on die termination circuit; and
terminating the external signal.

8. A device comprising:
means for detecting a condition in a device;
means for generating an encoded signal based on the condition;
means for converting the encoded signal into a truncated condition code to program the on die termination circuit; and
means for programming an on die termination circuit based on the encoded signal.

9. The device of claim 8, further comprising:
means for receiving an external signal at a rate of 200 to 400 mega transfers per second (MTS) at the on die termination circuit; and
means for terminating the external signal.

* * * * *